US009904135B1

(12) United States Patent
Fan

(10) Patent No.: US 9,904,135 B1
(45) Date of Patent: Feb. 27, 2018

(54) ARRAY SUBSTRATE AND LIQUID CRYSTAL DISPLAY DEVICE

(71) Applicant: Wuhan China Star Optoelectronics Technology Co., Ltd., Wuhan, Hubei (CN)

(72) Inventor: Guangbao Fan, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 158 days.

(21) Appl. No.: 15/100,299

(22) PCT Filed: May 13, 2016

(86) PCT No.: PCT/CN2016/082104
§ 371 (c)(1),
(2) Date: May 28, 2016

(87) PCT Pub. No.: WO2017/128557
PCT Pub. Date: Aug. 3, 2017

(30) Foreign Application Priority Data

Jan. 25, 2016 (CN) .......................... 2016 1 0047658

(51) Int. Cl.
*H01L 29/786* (2006.01)
*G02F 1/1368* (2006.01)
*G02F 1/1362* (2006.01)

(52) U.S. Cl.
CPC ...... *G02F 1/1368* (2013.01); *G02F 1/136209* (2013.01); *G02F 1/136227* (2013.01);
(Continued)

(58) Field of Classification Search
CPC ............. H01L 29/66757; H01L 29/786; H01L 29/78621; H01L 29/6675; H01L 21/775; H01L 21/12
See application file for complete search history.

(56) References Cited

U.S. PATENT DOCUMENTS 9,627,417 B2 * 4/2017 Lee ........................ H01L 27/124

FOREIGN PATENT DOCUMENTS

CN 202631914 U 12/2012
CN 104167418 A 11/2014
(Continued)

*Primary Examiner* — Quoc Hoang
(74) *Attorney, Agent, or Firm* — Andrew C. Cheng

(57) ABSTRACT

An array substrate and an LCD device are provided. The array substrate includes multiple LTPS thin-film transistors. Each transistor includes: a substrate; and a LTPS layer, a first insulation layer, a gate electrode, a second insulation layer, a source electrode, a drain electrode, a planarization layer, a first transparent conductive layer, a third insulation layer, a second transparent conductive layer and a connection metal layer. The LTPS layer, and gate electrode and the second insulation layer are sequentially disposed. The source electrode and the drain electrode are disposed on the second insulation layer, and connected with two terminals of the LTPS layer through the first and second through holes. The connection metal layer connects with the second transparent conductive layer and the drain electrode through a fourth through hole. The first transparent conductive layer is a common electrode and the second transparent conductive layer is a pixel electrode.

18 Claims, 2 Drawing Sheets

(52) U.S. Cl.
CPC .............. *G02F 2001/13685* (2013.01); *G02F 2202/104* (2013.01); *H01L 29/78621* (2013.01)

(56) References Cited

FOREIGN PATENT DOCUMENTS

| | | |
|---|---|---|
| CN | 104571700 A | 4/2015 |
| CN | 104600079 A | 5/2015 |
| CN | 105572993 A | 5/2016 |
| JP | 11126907 A | 5/1999 |

* cited by examiner

ARRAY SUBSTRATE AND LIQUID CRYSTAL DISPLAY DEVICE

CROSS REFERENCE

The claims of this application have submitted to the State Intellectual Property Office of the People's Republic of China (SIPO) on Jan. 25, 2016, Application No. 201610047658.7. The priority right based on the China application has a title of "Array substrate and liquid crystal display device". The entire contents of the above-mentioned patent application will be incorporated in the present application through citing.

BACKGROUND OF THE INVENTION

1. Field of the Invention

The present invention relates to a display technology field, and more particularly to an array substrate and a liquid crystal display device.

2. Description of Related Art

A liquid crystal display (LCD) is a common electronic equipment. Because the features of low power consumption, small size, light weight and so on, the LCD is favored by a user. Along with the development of the flat display technology, a demand for a high resolution and low power consumption liquid crystal display device is raised. The electron mobility of the amorphous silicon is lower, and Low Temperature Ploy-silicon (LTPS) can be manufactured in a low temperature such that the LTPS has a higher electron mobility than the amorphous silicon. In addition, the Complementary Metal Oxide Semiconductor (CMOS) device manufactured by the LTPS has a higher resolution and lower power consumption. Therefore, the LTPS has been widely applied and researched. The LTPS array substrate includes multiple Low-temperature polysilicon thin film transistors arranged as a matrix. Each of the Low-temperature polysilicon thin film transistors includes a drain electrode, an insulation layer and a pixel electrode. The insulation layer is provided with a through hole that reveals the drain electrode. The pixel electrode is connected with the drain electrode through a through hole. Because the structure of a LTPS array substrate is complicated. When manufacturing, an abnormal of incomplete through hole will generate on the insulation layer such that a charging to the pixel electrode from the drain electrode cannot be operate normally in order to affect the yield rate of the liquid crystal display.

SUMMARY OF THE INVENTION

The present invention provides an array substrate including multiple low-temperature polysilicon thin film transistors arranged as a matrix, wherein each low-temperature polysilicon thin film transistor comprises: a substrate; a low-temperature polysilicon layer, a first insulation layer, a gate electrode, a second insulation layer, a source electrode, a drain electrode, a planarization layer, a first transparent conductive layer, a third insulation layer, a second transparent conductive layer and a connection metal layer which are disposed at a same side of the array substrate; wherein, the low-temperature polysilicon layer is disposed adjacent to a surface of the substrate; the first insulation layer covers the low-temperature polysilicon layer; the gate electrode is disposed at a surface of the first insulation layer away from the low-temperature polysilicon layer; the second insulation layer covers the gate electrode; the second insulation layer is provided with a first through hole and a second through hole; the source electrode and the drain electrode are disposed on the second insulation layer; the source electrode is connected with one terminal of the low-temperature polysilicon layer through the first through hole; the drain electrode is connected with the other terminal of the low-temperature polysilicon layer through the second through hole; the planarization layer covers the source electrode and the drain electrode; the planarization layer is provided with a third through hole corresponding to the drain electrode; the first transparent conductive layer is disposed at a surface of the planarization layer away from the source electrode and the drain electrode; the third insulation layer covers the first transparent conductive layer, and the third insulation layer fills the third through hole; the third insulation layer is provided with a fourth through hole that reveals the drain electrode; the second transparent conductive layer is disposed on the third insulation layer; the connection metal layer connects with the second transparent conductive layer and the drain electrode through the fourth through hole; and the first transparent conductive layer is a common electrode, the second transparent conductive layer is a pixel electrode.

Wherein, the connection metal layer includes tungsten.

Wherein, the low-temperature polysilicon thin film transistor further includes a light-shielding layer; the light-shielding layer is disposed on a surface of the substrate; the low-temperature polysilicon layer, the first insulation layer, the gate electrode, the second insulation layer, the source electrode, the drain electrode, the planarization layer, the first transparent conductive layer, the third insulation layer, the second transparent conductive layer and the connection metal layer are disposed at a same side of the substrate through the light-shielding layer; and the light-shielding layer is disposed corresponding to the low-temperature polysilicon layer.

Wherein, the low-temperature polysilicon thin film transistor further includes a buffer layer, and the buffer layer covers the light-shielding layer; and the low-temperature polysilicon layer, the first insulation layer, the gate electrode, the second insulation layer, the source electrode, the drain electrode, the planarization layer, the first transparent conductive layer, the third insulation layer, the second transparent conductive layer and the connection metal layer are disposed at the surface of the substrate through the buffer layer and the light-shielding layer.

Wherein, the low-temperature polysilicon thin film transistor further includes a first ohmic contact layer; the first ohmic contact layer connects to the source electrode and the low-temperature polysilicon layer; the first ohmic contact layer is used to decrease a contact resistance between the source electrode and the low-temperature polysilicon layer.

Wherein, the first ohmic contact layer includes a first light-doping region and a first heavy-doping region; the first light-doping region is contacted with the low-temperature polysilicon layer; the first heavy-doping region is disposed between the source electrode and the first light-doping region; the first heavy-doping region is connected between the source electrode and the first light-doping region; wherein, a doping concentration of the first light-doping region is less than a doping concentration of the first heavy-doping region.

Wherein, the low-temperature polysilicon thin film transistor further includes a second ohmic contact layer; the second ohmic contact layer connects with the drain electrode and the low-temperature polysilicon layer; and the second ohmic contact layer is used to decrease a contact resistance between the drain electrode and the low-temperature polysilicon layer.

Wherein the second ohmic contact layer includes a second light-doping region and a second heavy-doping region; the second light-doping region is contacted with the low-temperature polysilicon layer, the second heavy-doping region is connected between the drain electrode and the second light-doping region; wherein, a doping concentration of the second light-doping region is less than a doping concentration of the second heavy-doping region.

Wherein, a material of each of the gate electrode and the drain electrode includes anyone of aluminum (Al) and molybdenum (Mo).

The present invention also provides a liquid crystal display device, and the liquid crystal display device includes an array substrate described in anyone of previous embodiments.

Comparing to the conventional art, in the low-temperature polysilicon thin film transistor of the array substrate of the present invention, the third insulation layer is provided with the fourth through hole, and through the connection metal layer to connect the pixel electrode and the drain electrode. Accordingly, unable to charge the pixel electrode normally by the drain electrode because of an incomplete through hole on the third insulation layer can avoided. In summary, the pixel electrode and the drain electrode in the low-temperature polysilicon thin film transistor of the array substrate of the present invention are electrically connected through the metal layer such that the drain electrode can charge the pixel electrode normally so as to increase the yield rate of the liquid crystal display device.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
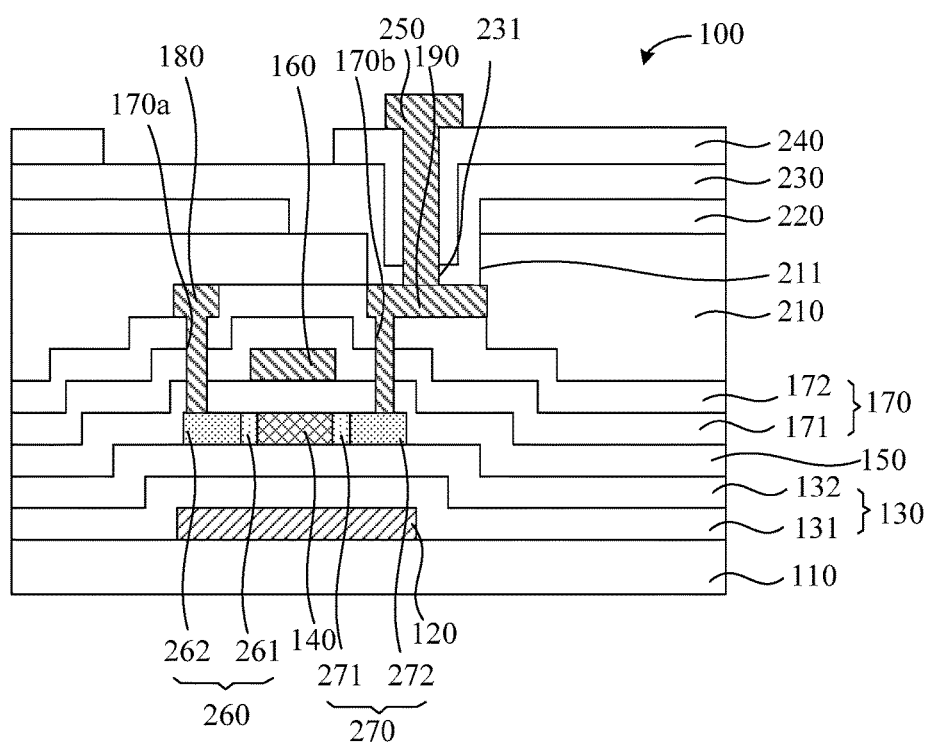
FIG. 1 is a schematic sectional structure of an array substrate according to a preferred embodiment of the present invention.

With reference to FIG. 1, and FIG. 1 is schematic sectional structure of an array substrate according to a preferred embodiment of the present invention. The array substrate 10 includes multiple low-temperature polysilicon thin film transistors 100. Each low-temperature polysilicon thin film transistor 100 includes a substrate 110 and a low-temperature polysilicon layer 140, a first insulation layer 150, a gate electrode 160, a second insulation layer 170, a source electrode 180, a drain electrode 190, a planarization layer 210, a first transparent conductive layer 220, a third insulation layer 230, a second transparent conductive layer 240 and a connection metal layer 250 which are disposed at a same side of the array substrate 10.

The low-temperature polysilicon layer 140 is disposed adjacent to a surface of the substrate 110. The first insulation layer 150 covers the low-temperature polysilicon layer 140, the gate electrode 160 is disposed at a surface of the first insulation layer 150 away from the low-temperature polysilicon layer 140, the second insulation layer 170 covers the gate electrode 160 and the second insulation layer 170 is provided with a first through hole 170a and a second through hole 170b. The source electrode 180 and the drain electrode 190 are disposed on the second insulation layer 170. Besides, the source electrode 180 is connected with one terminal of the low-temperature polysilicon layer 140 through the first through hole 170a, and the drain electrode 190 is connected with the other terminal of the low-temperature polysilicon layer 140 through the second through hole 170b. The planarization layer 210 covers the source electrode 180 and the drain electrode 190, and the planarization layer 210 is provided with a third through hole 211 corresponding to the drain electrode 190. The first transparent conductive layer 220 is disposed at a surface of the planarization layer 210 away from the source electrode 180 and the drain electrode 190.

The third insulation layer 230 covers the first transparent conductive layer 220, and the third insulation layer 230 fills the third through hole 211. The third insulation layer 230 is provided with a fourth through hole 231 that reveals the drain electrode 190. The second transparent conductive layer 240 is disposed on the third insulation layer 230. The connection metal layer 250 connects with the second transparent conductive layer 240 and the drain electrode 190 through the fourth through hole 231. Wherein, the first transparent conductive layer 220 is a common electrode, the second transparent conductive layer 240 is a pixel electrode. Preferably, the connection metal layer 250 includes tungsten.

The substrate 110 can be but not limited to an insulation substrate such as a glass substrate or a plastic substrate.

The low-temperature polysilicon thin film transistor 100 further includes a light-shielding layer 120. The light-shielding layer 120 is disposed on a surface of the substrate 110. Besides, the low-temperature polysilicon layer 140, the first insulation layer 150, the gate electrode 160, the second insulation layer 170, the source electrode 180, the drain electrode 190, the planarization layer 210, the first transparent conductive layer 220, the third insulation layer 230, the second transparent conductive layer 240 and the connection metal layer 250 are disposed at a same side of the substrate 110 through the light-shielding layer 120. The light-shielding layer 120 is disposed corresponding to the low-temperature polysilicon layer 140. The light-shielding layer 120 is used for preventing a pixel corresponding to the low-temperature polysilicon thin film transistor from leaking light to the substrate 110 disposed away from the light-shielding layer 120.

The low-temperature polysilicon thin film transistor 100 further includes a buffer layer 130. The buffer layer 130 covers the light-shielding layer 120. The low-temperature polysilicon layer 140, the first insulation layer 150, the gate electrode 160, the second insulation layer 170, the source electrode 180, the drain electrode 190, the planarization layer 210, the first transparent conductive layer 220, the third insulation layer 230, the second transparent conductive layer 240 and the connection metal layer 250 are disposed at the surface of the substrate 110 through the buffer layer 130 and the light-shielding layer 120. The buffer layer 130 is used for buffering a damage to the substrate 110 in the manufacturing process of the array substrate 10.

In the present embodiment, the buffer layer 130 includes a first sub-buffering layer 131 and a second sub-buffering layer 132. The first sub-buffering layer 131 is adjacent to the substrate 110 comparing to the second sub-buffering layer 132. The material of the first sub-buffering layer 131 is SiNx. The material of the second sub-buffering layer 132 is SiOx. The disposition of the first sub-buffering layer 131 and the second sub-buffering layer 132 can better buffer the damage of the substrate 110 in the manufacturing process of the array substrate 10. Besides, the first sub-buffering layer 131 adopts the SiNx material, when preparing the SiNx material, hydrogen (H) element can be generated to repair the low-temperature polysilicon layer 140 and increase the electric performance of the low-temperature polysilicon layer 140. The second sub-buffering layer 132 adopts the SiOx material, which can improve the stress of the second sub-buffering layer 132 to prevent the second sub-buffering layer 132 from shedding.

The second insulation layer 170 includes a first sub-insulation layer 171 and a second sub-insulation layer 172. The first sub-insulation layer 171 is adjacent to the gate electrode 160 comparing to the second sub-insulation layer 172. The material of the first sub-insulation layer 171 is a SiOx material. The material of the second sub-insulation layer 172 is a SiNx material. The first sub-insulation layer 171 adopts the SiOx material, which can improve the stress of the first sub-insulation layer 171 and prevent the first sub-insulation layer 171 from shedding. The second sub-insulation layer 172 adopts the SiNx material, when preparing the SiNx material, hydrogen (H) element can be generated to repair the low-temperature polysilicon layer 140 and increase the electric performance of the low-temperature polysilicon layer 140.

The material of each source electrode 180 and the drain electrode 190 is metal. For example, aluminum (Al) or molybdenum (Mo). In the present embodiment, the material of each of the source electrode 180 and the drain electrode 190 can include anyone of aluminum (Al) and molybdenum (Mo).

The first transparent conductive layer 220 and the second transparent conductive layer 240 can be but not limited to Indium Tin oxide (ITO).

When the planarization layer 210 is provided with the third through hole 211, a pico-laser device can be used to perform a precision control, to prevent the damage of the drain electrode 190 when providing the third through hole 211. Correspondingly, when the third insulation layer 230 is provided with the fourth through hole 231, the pico-laser device can be used to perform a precision control, to prevent the damage of the drain electrode 190 when providing the fourth through hole 231.

The connection metal layer 250 can be formed through a Laser Chemical Vapor Deposition (LCVD) device. When the metal layer 250 is tungsten, a laser provided by the Laser Chemical Vapor Deposition (LCVD) device can be used to decompose W(CO)6, in order to form tungsten atoms precipitation so as to form the connection metal layer 250. Because the manufacturing factory for liquid crystal display device generally has the Laser Chemical Vapor Deposition device, no new device or upgrading the device is required.

The low-temperature polysilicon thin film transistor 100 further includes a first ohmic contact layer 260. The first ohmic contact layer 260 connects to the source electrode 180 and the low-temperature polysilicon layer 140. The first ohmic contact layer 260 is used to decrease a contact resistance between the source electrode 180 and the low-temperature polysilicon layer 140. In the present embodiment, the first ohmic contact layer 260 and the low-temperature polysilicon layer 140 are located at a same layer.

The first ohmic contact layer 260 can be formed through an ion implantation method to the low-temperature polysilicon layer 140. The first ohmic contact layer 260 includes a first light-doping region 261 and a first heavy-doping region 262. The first light-doping region 261 is contacted with the low-temperature polysilicon layer 140, the first heavy-doping region 262 is disposed between the source electrode 180 and the first light-doping region 261. The first heavy-doping region 262 is connected between the source electrode 180 and the first light-doping region 261. Wherein, a doping concentration of the first light-doping region 261 is less than a doping concentration of the first heavy-doping region.

The type of the doped ions of the first light-doping region 261 and the first heavy-doping region 262 are the same. For example, an N-type ion can be adopted. In the present embodiment, the disposition of the first light-doping region 261 and the first heavy-doping region 262 can decrease the contact resistance between the source electrode 180 and the low-temperature polysilicon layer 140, and decrease the leakage current of the low-temperature polysilicon thin film transistor 100.

The low-temperature polysilicon thin film transistor 100 further includes a second ohmic contact layer 270. The second ohmic contact layer 270 connects with the drain electrode 190 and the low-temperature polysilicon layer 140. The second ohmic contact layer 270 is used to decrease a contact resistance between the drain electrode 190 and the low-temperature polysilicon layer 140. In the present embodiment, the second ohmic contact layer 270 includes a second light-doping region 271 and a second heavy-doping region 272. The second light-doping region 271 is contacted with the low-temperature polysilicon layer 140, the second heavy-doping region 272 is connected between the drain electrode 190 and the second light-doping region 271. Wherein, a doping concentration of the second light-doping region 271 is less than a doping concentration of the second heavy-doping region 272.

The type of the doped ions of the second light-doping region 271 and the second heavy-doping region 272 are the same. For example, an N-type ion can be adopted. In the present embodiment, the disposition of the second light-doping region 271 and the second heavy-doping region 272 can decrease the contact resistance between the drain electrode 190 and the low-temperature polysilicon layer 140, and decrease the leakage current of the low-temperature polysilicon thin film transistor 100.

Comparing to the conventional art, in the low-temperature polysilicon thin film transistor 100 of the array substrate 10 of the present invention, the third insulation layer 230 is provided with the fourth through hole 231, and through the connection metal layer 250 to connect the pixel electrode and the drain electrode. Accordingly, unable to charge the pixel electrode normally by the drain electrode because of an incomplete through hole on the third insulation layer 230 can avoided. In summary, the pixel electrode and the drain electrode in the low-temperature polysilicon thin film transistor 100 of the array substrate 10 of the present invention are electrically connected through the metal layer 250 such that the drain electrode can charge the pixel electrode normally so as to increase the yield rate of the liquid crystal display device.

Figure 2:
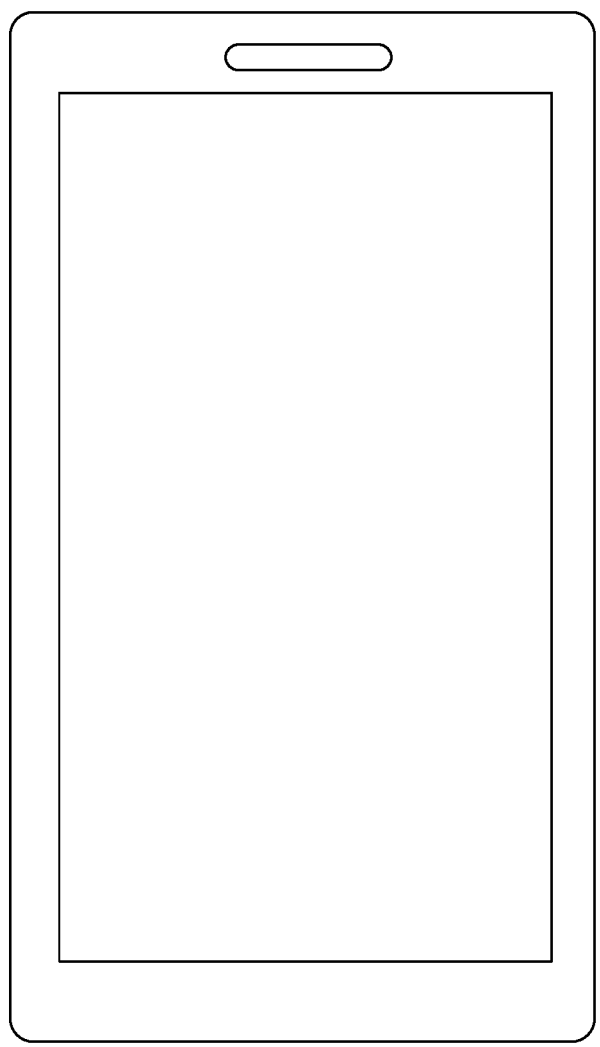
FIG. 2 is a schematic diagram of a liquid crystal display device according to a preferred embodiment of the present invention.

The present invention also provides a liquid crystal display device 1, with further reference to FIG. 2, and FIG. 2 is a schematic diagram of a liquid crystal display device according to a preferred embodiment of the present invention. The liquid crystal display device includes an array substrate described previously, no more repeating here. The liquid crystal display device 1 can include but not limited to a smart phone, a Mobile Internet Device (MID), an electric book, a Play Station Portable (PSP) or a Personal Digital Assistant (PDA), or a liquid crystal display.

The above embodiment does not constitute a limitation of the scope of protection of the present technology solution. Any modifications, equivalent replacements and improvements based on the spirit and principles of the above embodiments should also be included in the protection scope of the present technology solution.

What is claimed is:

1. An array substrate including multiple low-temperature polysilicon thin film transistors arranged as a matrix, wherein each low-temperature polysilicon thin film transistor comprises:
   a substrate; and
   a low-temperature polysilicon layer, a first insulation layer, a gate electrode, a second insulation layer, a source electrode, a drain electrode, a planarization layer, a first transparent conductive layer, a third insulation layer, a second transparent conductive layer and a connection metal layer which are disposed at a same side of the array substrate;
   wherein, the low-temperature polysilicon layer is disposed adjacent to a surface of the substrate; the first insulation layer covers the low-temperature polysilicon layer; the gate electrode is disposed at a surface of the first insulation layer away from the low-temperature polysilicon layer; the second insulation layer covers the gate electrode; the second insulation layer is provided with a first through hole and a second through hole; the source electrode and the drain electrode are disposed on the second insulation layer; the source electrode is connected with one terminal of the low-temperature polysilicon layer through the first through hole; the drain electrode is connected with the other terminal of the low-temperature polysilicon layer through the second through hole; the planarization layer covers the source electrode and the drain electrode; the planarization layer is provided with a third through hole corresponding to the drain electrode; the first transparent conductive layer is disposed at a surface of the planarization layer away from the source electrode and the drain electrode; the third insulation layer covers the first transparent conductive layer, and the third insulation layer fills the third through hole; the third insulation layer is provided with a fourth through hole that reveals the drain electrode; the second transparent conductive layer is disposed on the third insulation layer; the connection metal layer connects with the second transparent conductive layer and the drain electrode through the fourth through hole; and the first transparent conductive layer is a common electrode, the second transparent conductive layer is a pixel electrode.

2. The array substrate according to claim 1, wherein, the connection metal layer includes tungsten.

3. The array substrate according to claim 1, wherein, the low-temperature polysilicon thin film transistor further includes a light-shielding layer; the light-shielding layer is disposed on a surface of the substrate; the low-temperature polysilicon layer, the first insulation layer, the gate electrode, the second insulation layer, the source electrode, the drain electrode, the planarization layer, the first transparent conductive layer, the third insulation layer, the second transparent conductive layer and the connection metal layer are disposed at a same side of the substrate through the light-shielding layer; and the light-shielding layer is disposed corresponding to the low-temperature polysilicon layer.

4. The array substrate according to claim 3, wherein, the low-temperature polysilicon thin film transistor further includes a buffer layer, and the buffer layer covers the light-shielding layer; and the low-temperature polysilicon layer, the first insulation layer, the gate electrode, the second insulation layer, the source electrode, the drain electrode, the planarization layer, the first transparent conductive layer, the third insulation layer, the second transparent conductive layer and the connection metal layer are disposed at the surface of the substrate through the buffer layer and the light-shielding layer.

5. The array substrate according to claim 1, wherein, the low-temperature polysilicon thin film transistor further includes a first ohmic contact layer; the first ohmic contact layer connects to the source electrode and the low-temperature polysilicon layer; the first ohmic contact layer is used to decrease a contact resistance between the source electrode and the low-temperature polysilicon layer.

6. The array substrate according to claim 5, wherein, the first ohmic contact layer includes a first light-doping region and a first heavy-doping region; the first light-doping region is contacted with the low-temperature polysilicon layer; the first heavy-doping region is disposed between the source electrode and the first light-doping region; the first heavy-doping region is connected between the source electrode and the first light-doping region; wherein, a doping concentration of the first light-doping region is less than a doping concentration of the first heavy-doping region.

7. The array substrate according to claim 1, wherein, the low-temperature polysilicon thin film transistor further includes a second ohmic contact layer; the second ohmic contact layer connects with the drain electrode and the low-temperature polysilicon layer; and the second ohmic contact layer is used to decrease a contact resistance between the drain electrode and the low-temperature polysilicon layer.

8. The array substrate according to claim 7, wherein the second ohmic contact layer includes a second light-doping region and a second heavy-doping region; the second light-doping region is contacted with the low-temperature polysilicon layer, the second heavy-doping region is connected between the drain electrode and the second light-doping region; wherein, a doping concentration of the second light-doping region is less than a doping concentration of the second heavy-doping region.

9. The array substrate according to claim 1, wherein, a material of each of the gate electrode and the drain electrode includes anyone of aluminum (Al) and molybdenum (Mo).

10. A liquid crystal display device including an array substrate, and the array substrate has multiple low-temperature polysilicon thin film transistors arranged as a matrix, wherein each low-temperature polysilicon thin film transistor comprises:
    a substrate; and a low-temperature polysilicon layer, a first insulation layer, a gate electrode, a second insulation layer, a source electrode, a drain electrode, a planarization layer, a first transparent conductive layer, a third insulation layer, a second transparent conductive layer and a connection metal layer which are disposed at a same side of the array substrate;

wherein, the low-temperature polysilicon layer is disposed adjacent to a surface of the substrate; the first insulation layer covers the low-temperature polysilicon layer; the gate electrode is disposed at a surface of the first insulation layer away from the low-temperature polysilicon layer; the second insulation layer covers the gate electrode; the second insulation layer is provided with a first through hole and a second through hole; the source electrode and the drain electrode are disposed on the second insulation layer; the source electrode is connected with one terminal of the low-temperature polysilicon layer through the first through hole; the drain electrode is connected with the other terminal of the low-temperature polysilicon layer through the second through hole; the planarization layer covers the source electrode and the drain electrode; the planarization layer is provided with a third through hole corresponding to the drain electrode; the first transparent conductive layer is disposed at a surface of the planarization layer away from the source electrode and the drain electrode; the third insulation layer covers the first transparent conductive layer, and the third insulation layer fills the third through hole; the third insulation layer is provided with a fourth through hole that reveals the drain electrode; the second transparent conductive layer is disposed on the third insulation layer; the connection metal layer connects with the second transparent conductive layer and the drain electrode through the fourth through hole; and the first transparent conductive layer is a common electrode, the second transparent conductive layer is a pixel electrode.

11. The liquid crystal display device according to claim 10, wherein, the connection metal layer includes tungsten.

12. The liquid crystal display device according to claim 10, wherein, the low-temperature polysilicon thin film transistor further includes a light-shielding layer; the light-shielding layer is disposed on a surface of the substrate; the low-temperature polysilicon layer, the first insulation layer, the gate electrode, the second insulation layer, the source electrode, the drain electrode, the planarization layer, the first transparent conductive layer, the third insulation layer, the second transparent conductive layer and the connection metal layer are disposed at a same side of the substrate through the light-shielding layer; and the light-shielding layer is disposed corresponding to the low-temperature polysilicon layer.

13. The liquid crystal display device according to claim 12, wherein, the low-temperature polysilicon thin film transistor further includes a buffer layer, and the buffer layer covers the light-shielding layer; and the low-temperature polysilicon layer, the first insulation layer, the gate electrode, the second insulation layer, the source electrode, the drain electrode, the planarization layer, the first transparent conductive layer, the third insulation layer, the second transparent conductive layer and the connection metal layer are disposed at the surface of the substrate through the buffer layer and the light-shielding layer.

14. The liquid crystal display device according to claim 10, wherein, the low-temperature polysilicon thin film transistor further includes a first ohmic contact layer; the first ohmic contact layer connects to the source electrode and the low-temperature polysilicon layer; the first ohmic contact layer is used to decrease a contact resistance between the source electrode and the low-temperature polysilicon layer.

15. The liquid crystal display device according to claim 14, wherein, the first ohmic contact layer includes a first light-doping region and a first heavy-doping region; the first light-doping region is contacted with the low-temperature polysilicon layer; the first heavy-doping region is disposed between the source electrode and the first light-doping region; the first heavy-doping region is connected between the source electrode and the first light-doping region; wherein, a doping concentration of the first light-doping region is less than a doping concentration of the first heavy-doping region.

16. The liquid crystal display device according to claim 10, wherein, the low-temperature polysilicon thin film transistor further includes a second ohmic contact layer; the second ohmic contact layer connects with the drain electrode and the low-temperature polysilicon layer; and the second ohmic contact layer is used to decrease a contact resistance between the drain electrode and the low-temperature polysilicon layer.

17. The liquid crystal display device according to claim 16, wherein, the second ohmic contact layer includes a second light-doping region and a second heavy-doping region; the second light-doping region is contacted with the low-temperature polysilicon layer, the second heavy-doping region is connected between the drain electrode and the second light-doping region; wherein, a doping concentration of the second light-doping region is less than a doping concentration of the second heavy-doping region.

18. The liquid crystal display device according to claim 10, wherein, a material of each of the gate electrode and the drain electrode includes anyone of aluminum (Al) and molybdenum (Mo).

* * * * *